United States Patent
Lee

(10) Patent No.: US 8,710,570 B2
(45) Date of Patent: Apr. 29, 2014

(54) SEMICONDUCTOR DEVICE HAVING VERTICAL CHANNEL

(75) Inventor: Woo Jun Lee, Icheon (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 13/557,134

(22) Filed: Jul. 24, 2012

(65) Prior Publication Data

US 2014/0027916 A1    Jan. 30, 2014

(51) Int. Cl.
 H01L 27/108 (2006.01)
 H01L 29/76 (2006.01)
 H01L 29/94 (2006.01)
 H01L 31/119 (2006.01)

(52) U.S. Cl.
 USPC .................................. 257/306; 257/E27.084

(58) Field of Classification Search
 USPC ............................................ 257/306, E27.084
 See application file for complete search history.

(56) References Cited

U.S. PATENT DOCUMENTS

2012/0182784 A1*  7/2012  Murooka ....................... 365/148
2012/0211815 A1*  8/2012  Mikasa ........................ 257/306
2012/0282770 A1*  11/2012  Ko ................................ 438/664

* cited by examiner

*Primary Examiner* — Phuc Dang

(57) ABSTRACT

A semiconductor device includes: bit lines each extending in a first direction; word lines each extending in a second direction, which crosses the first direction; pillars provided in a region between the bit lines and the word lines, wherein the pillars are each arranged along a third direction; and bit line contacts arranged along the third direction and alternately between the pillars and coupled to alternate bit lines.

33 Claims, 12 Drawing Sheets

Cell Array

SEMICONDUCTOR DEVICE HAVING VERTICAL CHANNEL

CROSS-REFERENCE TO RELATED APPLICATION

Background of the Invention

1. Technical Field

The present inventive relates to a semiconductor device, and more specifically, to a semiconductor device employing a pillar structure and a vertical channel structure.

2. Related Art

A conventional transistor has a planar channel structure, which is horizontally arranged between a source and a drain. As a unit cell size of a semiconductor device reduces, a length of the planar channel is also reduced. Reduced channel length causes short channel effects.

To overcome these issues, various channel structures have been suggested. One proposed solution is a vertical channel using a pillar. In that structure, a channel is formed along a sidewall of a vertical pillar, thus forming a vertical channel.

BRIEF SUMMARY OF THE INVENTION

A semiconductor device according to an embodiment of the present invention includes: bit lines each extending in a first direction X; word lines each extending in a second direction Y, which crosses the first direction; pillars provided in a region between the bit lines and the word lines, wherein the pillars are each arranged along a third direction Z; and bit line contacts arranged along the third direction and alternately between the pillars and coupled to alternate bit lines.

The pillars include first, second, third, and fourth pillars each arranged along the third direction Z. The bit lines include first, second, and third bit lines. The first bit line is provided between the first and the second pillars, the second bit line is provided between the second and the third pillars, and the third bit line is provided between the third and the fourth pillars. The bit line contacts include first and second bit line contacts. The first bit line contact is provided between the first and the second pillars and is coupled to the first bit line. The second bit line contact is provided between the third and the fourth pillars and is coupled to the third bit line.

The first bit line contact is coupled to the first or the second pillars. The second bit line contact is coupled to any of the third and the fourth pillars. The first bit line contact is coupled to both of the first and the second pillars. The second bit line contact is coupled to both of the third and the fourth pillars.

The pillars are formed over a semiconductor substrate. The semiconductor device further comprising a dielectric pattern between any of the pillars and the semiconductor substrate.

The semiconductor device further comprising: first junction regions formed in the pillars and coupled to bit line contacts. The dielectric pattern is configured to prevent a channel from being created between neighboring first junction regions through the semiconductor substrate. The dielectric pattern is an air gap.

A semiconductor device according to an embodiment of the present invention includes: a first pillar provided in a first row arranged in a first direction; a second pillar provided in a second row parallel to the first row; a first bit line extending in a second direction across the first direction and provided between the first and the second pillars; and a first bit line contact provided over the first bit line and between the first and the second pillars. The first bit line contact is coupled to any of the first and the second pillars.

The device may further include a first word line extending in the first direction and provided between the first and the second pillars. The first word line is coupled to the first or the second pillar.

The first and the second directions are perpendicular to each other. The first and the second pillars are arranged along a third direction. The third direction has an acute angle with respect to any of the first and the second direction. The first and the second pillars are formed over a semiconductor substrate. The semiconductor device further comprising a dielectric pattern between any of the first and the second pillars and the semiconductor substrate.

The semiconductor device may further include first junction regions formed in the pillars and coupled to bit line contacts. The dielectric pattern is configured to prevent a channel from being created between neighboring first junction regions through the semiconductor substrate. The dielectric pattern is an air gap.

A semiconductor device according to an embodiment of the present invention includes: first, second, and third bit lines each extending in a first direction; first and second word lines each extending in a second direction; a first pillar provided between the first and the second bit lines and coupled to the first word line; a second pillar provided between the second and the third bit lines and coupled to the second word line; and a first bit line contact between the first and the second pillars arranged along a third direction, wherein the first bit line contact is coupled to the second bit line.

Any of the first and the second pillars is coupled to the second bit line through the first bit line contact. Both of the first and the second pillars are coupled to the second bit line through the first bit line contact. The first bit line contact is provided over the second bit line. The first, the second, and the third bit lines are buried bit lines.

The first pillar is insulated from the first and the second bit lines. The second pillar is insulated from the second and the third bit lines. The first and the second pillars are formed over a semiconductor substrate. The semiconductor device further comprising a dielectric pattern 320 between any of the first and the second pillars and the semiconductor substrate.

The dielectric pattern 320 extends down to a first level. The first and the second bit line contacts each extend up to a second level higher than the first level. The first and the second word lines each extend up from a third level higher than the second level. The first and the second pillars are formed over a semiconductor substrate. The semiconductor device further comprising a dielectric pattern between any of the first and the second pillars and the semiconductor substrate.

The semiconductor device may further include: first junction regions formed in the pillars and coupled to bit line contacts. The dielectric pattern is configured to prevent a channel from being created between neighboring first junction regions through the semiconductor substrate. The dielectric pattern may include an air gap.

The device further comprising: a first bit line spacer configured to insulate the first pillar from the first and the second bit lines; and a second bit line spacers configured to insulate the second pillar from the second and the third bit lines.

The first bit line spacer is provided (i) between the first pillar and the first bit line and (ii) between the first pillar and the second bit line. The second bit line spacer is provided (i) between the second pillar and the second bit line and (ii) between the second pillar and the third bit line.

Each of the first and the second bit line spacers includes any of an oxide-containing pattern, a nitride-containing pattern, or a combination thereof. The first word line is coupled to the first pillar at a sidewall of the first pillar. The second word line is coupled to the second pillar at a sidewall of the second pillar.

The first and the second directions are perpendicular to each other. The third direction has an acute angle with respect to any of the first and the second directions. The semiconductor device includes a dynamic random access memory (DRAM), a synchronous dynamic random access memory (SRAM), a static random access memory (SRAM), a flash memory, a ferroelectric random access memory (FeRAM), a magnetic random access memory (MRAM), a phase change random access memory (PRAM), or a combination thereof.

A method for forming a semiconductor device according to an embodiment of the present invention includes: providing pillars over a substrate; providing bit lines between the pillars, wherein the bit lines each extend in a first direction; providing bit line contacts alternately between two pillars arranged along a second direction, wherein the bit line contacts are alternatively coupled to the bit lines. The first direction forms an acute angle with respect to the second direction.

The method may further include: providing word lines extending in a third direction between the pillars. The first direction and the third direction are perpendicular to each other. The bit line contacts are provided alternately over the bit lines.

The method may further include: forming bit line spacers configured to insulate the pillars from the bit lines. The bit line contacts are coupled to first sidewalls of the pillars. The word lines are coupled to second sidewalls of the pillars. The pillars are formed over a semiconductor substrate. The semiconductor device further comprising a dielectric pattern between any of the pillars and the semiconductor substrate.

The dielectric pattern extends down to a first level. The bit line contacts each extend up to a second level higher than the first level. The first and the second word lines each extend up from a third level higher than the second level.

A method for forming a semiconductor device according to an embodiment of the present invention includes: providing pillars over a substrate; forming bit line spacers at sidewalls of the pillars; forming bit lines between the pillars arranged in a first direction with the bit line spacers interposed between the pillars and the bit lines, wherein the bit lines extend in a second direction across the first direction; and forming bit line contacts between pillars arranged in a third direction.

The bit line contacts are coupled to alternate bit lines. The bit line contacts are formed between alternate pillars arranged in the third direction. The third direction forms an acute angle with respect to either the first or the second directions. The first and the second directions are perpendicular to each other. The pillars are formed over a semiconductor substrate. The semiconductor device further comprising a dielectric pattern between any of the pillars and the semiconductor substrate.

The dielectric pattern extends down to a first level. The bit line contacts each extend up to a second level higher than the first level. The first and the second word lines each extend up from a third level higher than the second level.

A method for forming a semiconductor device according to an embodiment of the present invention includes: providing a first epitaxial layer over a substrate; providing a second epitaxial layer over the first epitaxial layer; patterning the first and the second epitaxial layers to form (i) pillars arranged along a first direction and (ii) first trenches between the first pillars; forming bit lines in the first trenches so that the second epitaxial layer under the pillars are exposed, wherein the bit lines are extending along a second direction forming second trenches exposing even-numbered bit lines and not exposing odd-numbered bit lines; removing the second epitaxial layer between the pillars and the substrate to form cavities; forming first junction regions at sidewalls exposed by the second trenches; forming bit line contacts in the second trenches to couple the first junction regions to the even-numbered bit lines, and forming word lines coupled to the pillars and extending along a third direction. The first, the second, and the third directions are different from each other.

The second and the third directions are perpendicular to each other. The bit line contacts are configured to enclose the cavities to form air gaps between the pillars and the substrate. The air gaps are configured to prevent a channel from being created between neighboring first junction regions through the substrate. A dielectric material in the cavities to form dielectric patterns between the pillars and the substrate. The dielectric patterns have a dielectric constant of 4 or less and are configured to prevent a channel from being created between neighboring first junction regions through the substrate.

The step of removing the second epitaxial layer may include: forming first pillar spacer layers along sidewalls of the second trenches; providing sacrificial patterns in lower portion of the second trenches and between the first pillar spacer layers; forming second pillar spacer pattern along sidewalls of the first pillar spacer layers and over the sacrificial patterns; removing the sacrificial patterns; and patterning the first pillar spacer layers using the second pillar spacer patterns to form first pillar spacer patterns exposing sidewalls of the first epitaxial layers under the pillars.

The bit line contacts extend up to a first level. The cavities extend up to a second level lower than the first level. The second epitaxial layer is removed by a wet etching method.

The method may further include: forming second junction regions at upper portions of the pillars. The second junction regions extend down to a third level. The word lines are provided between the first and the second junction regions. The bit line contacts are provided alternately between pillars along the first direction.

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIG. 1b is a cross-sectional view along the line A-A' of the conventional semiconductor device shown in FIG. 1a.

FIG. 2b is a cross-sectional view along the line A-A' of the semiconductor device shown in FIG. 2a.

FIG. 2c is a cross-sectional view along the line B-B' of the semiconductor device shown in FIG. 2a.

FIG. 2d is a cross-sectional view along the line C-C' of the semiconductor device shown in FIG. 2a.

DESCRIPTION OF EMBODIMENTS

Figure 1A:
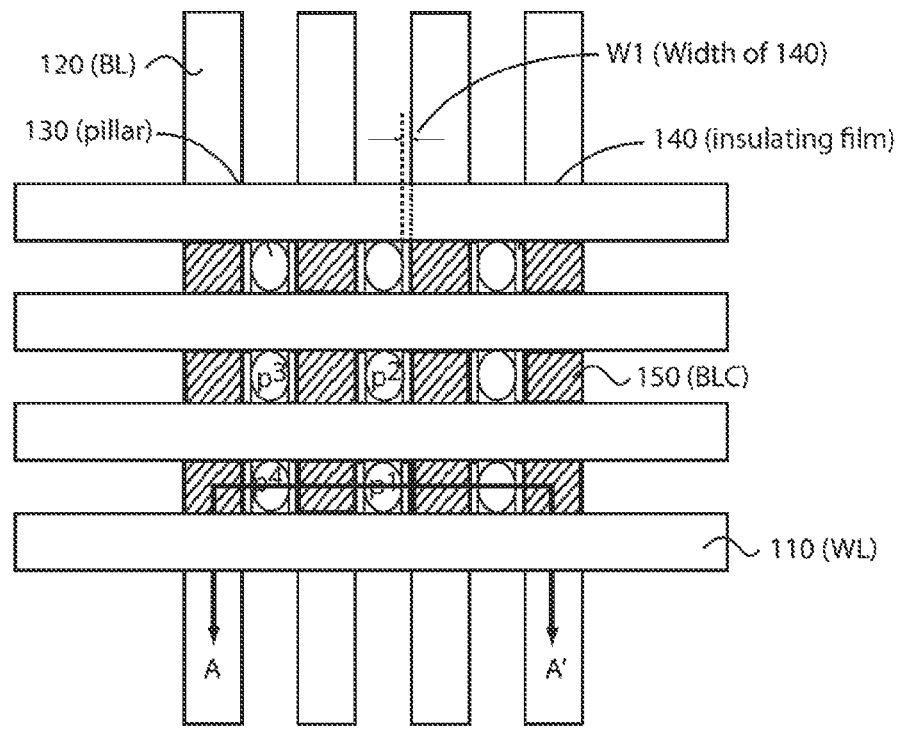
FIG. 1a is a plan view of a conventional semiconductor device employing a vertical channel using a pillar.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Since preferred embodiments are provided below, the order of the reference numerals given in the description is not limited thereto. In the drawings, the dimensions of layers and regions may be exaggerated for convenience of illustration. It should be understood that when a layer (or film) is referred to as being "on" another layer or substrate, it can be directly on the other layer or substrate, or intervening layers may also be present.

Figure 1B:
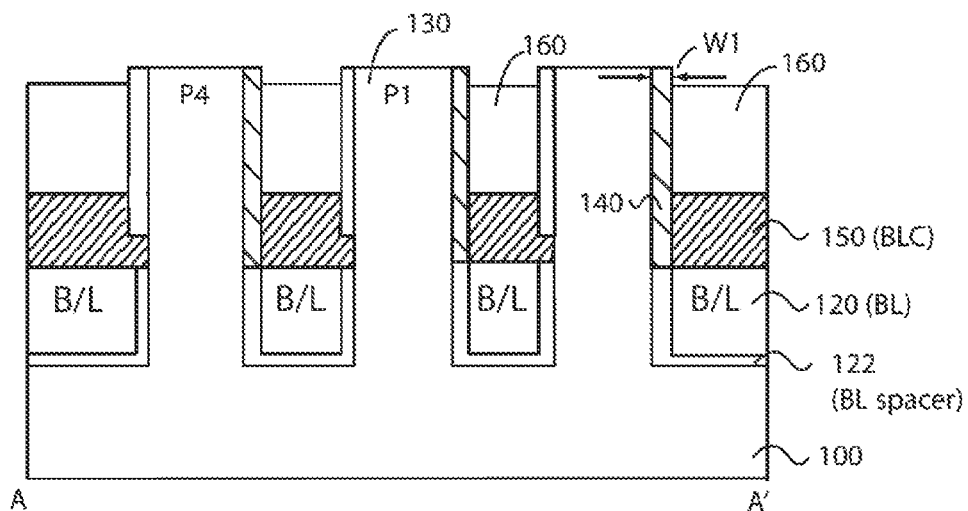

FIG. 1a is a plan view of a conventional semiconductor device employing a vertical channel using a pillar. FIG. 1b is a cross-sectional view along the line A-A' of the conventional semiconductor device of FIG. 1a.

Referring to FIGS. 1a and 1b, in a conventional semiconductor device with a vertical channel, bit lines 120 are arranged in a first direction X. Word lines 110 are arranged in a second direction Y, so as to across the bit lines 120.

Pillars 130 are arranged at areas defined by neighboring bit lines 120 and neighboring word lines 110. Accordingly, pillars 130 are arranged along the first direction X, the second direction Y, and a third direction Z. For example, pillars p1 and p2 are arranged along the first direction X, pillars p1 and p4 are arranged along the second direction Y, and pillars p1 and p3 are arranged along the third direction Z.

The bit lines 120 are insulated from the pillars 130 by bit line spacers 122.

Bit line contacts 150 are formed between pillars arranged in the second direction Y. For example, a bit line contact 150 is formed between the pillar p1 and p4 or between pillars p2 and p3. The bit line contacts 150 are formed over the bit lines 120 and coupled to the bit lines 120. Each of the bit line contacts 150 is coupled to one adjacent pillar, but is insulated from the other adjacent pillar by an insulating film 140. For example, in FIG. 1b, the bit line contact 150 between the pillars p1 and p4 is coupled to the pillar p1, but is insulated from the pillar p4 by the insulating film 140.

Because of a limited unit cell size, the insulating film 140 is formed to have a relatively small thickness W1. Thus, a current leakage results due to parasitic capacitance between the pillars 130 and the bit line contacts 150. Thus, it would be desirable to increase the thickness of the insulating film without increasing the unit cell size.

Hereinafter, a semiconductor device according to an embodiment of the present invention will be described with reference to FIGS. 2a-2d.

Figure 2A:
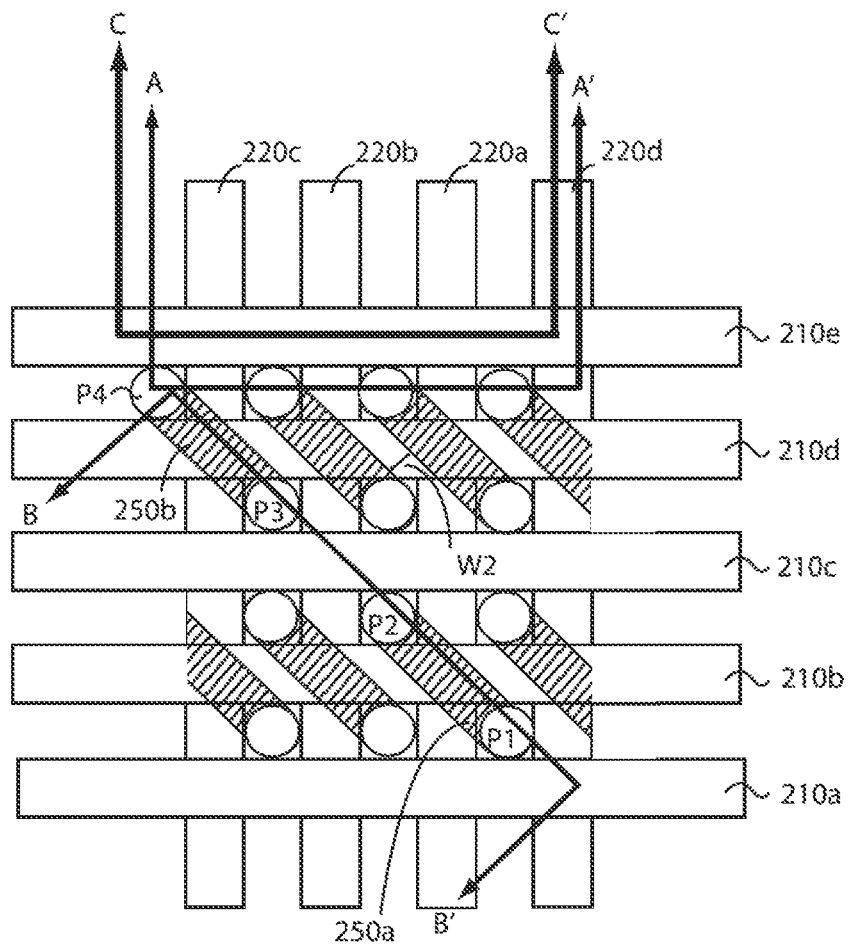
FIG. 2a is a plan view of a semiconductor device according to an embodiment of the present invention.
Figure 2B:
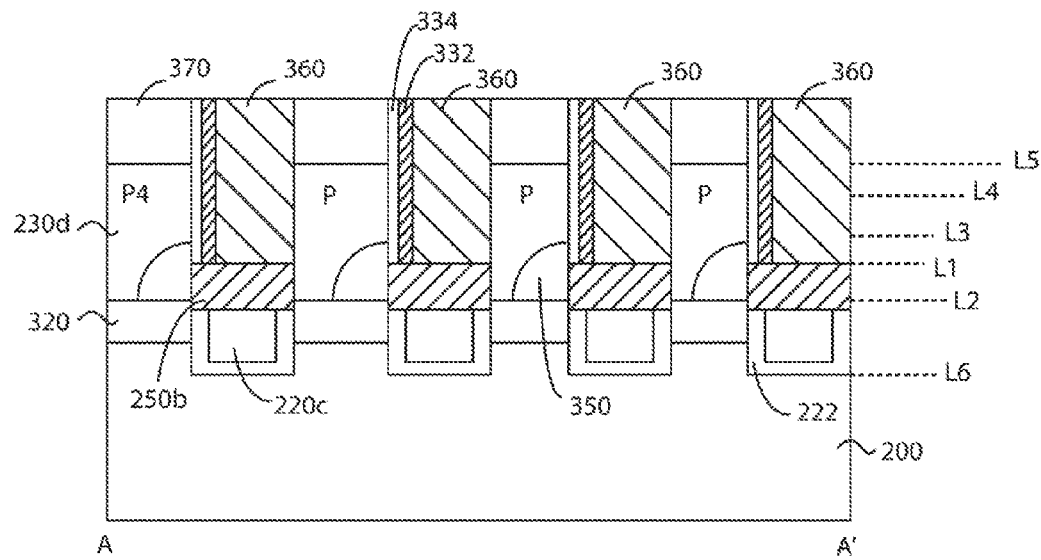
Figure 2C:
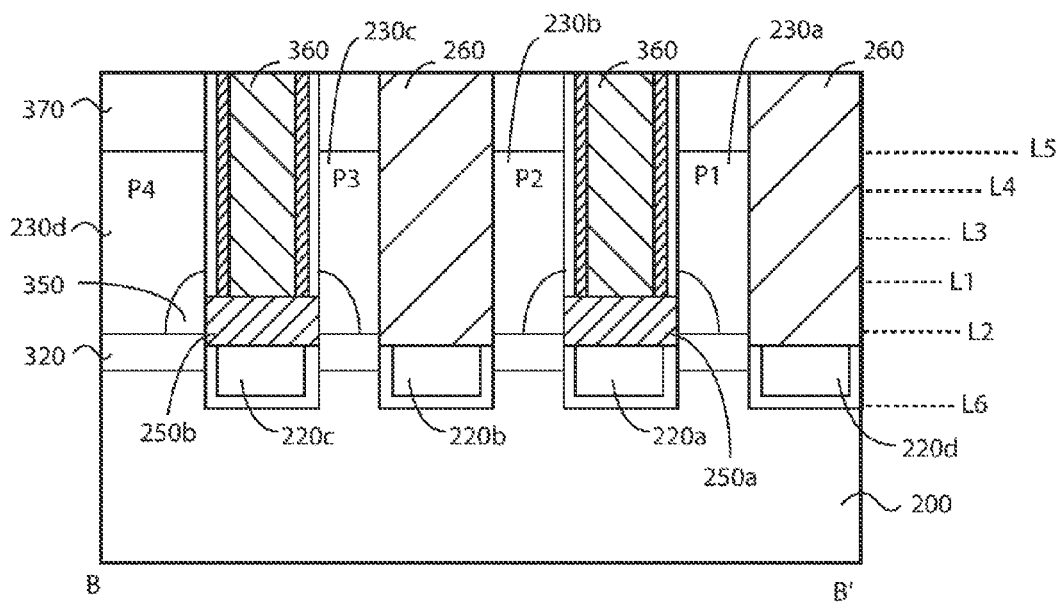
Figure 2D:
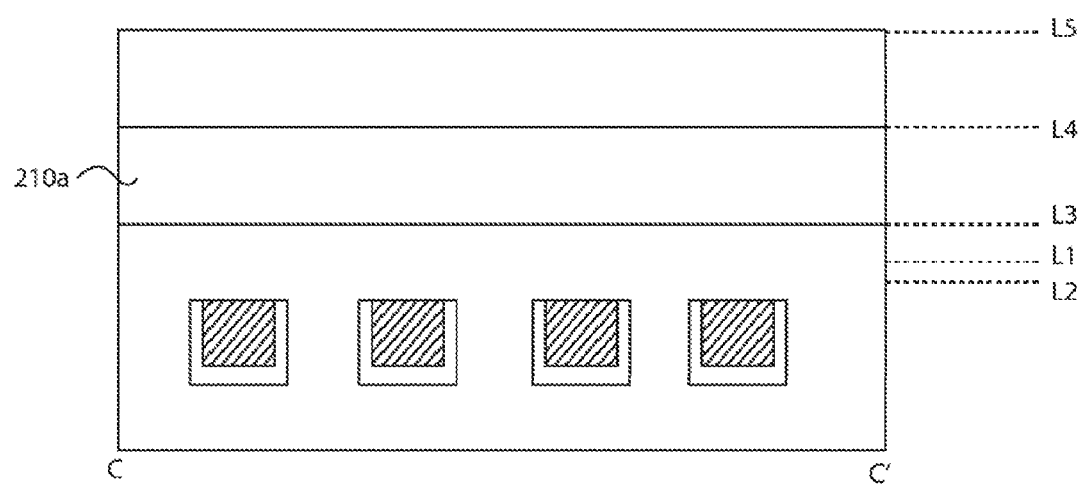

FIG. 2a shows a plan view of a semiconductor device according to an embodiment of the present invention. FIG. 2b shows a cross-sectional view along the line A-A' of the semiconductor device shown in FIG. 2a. FIG. 2c shows a cross-sectional view along the line B-B' of the semiconductor device shown in FIG. 2a. FIG. 2d shows a cross-sectional view along the line C-C' of the semiconductor device shown in FIG. 2a.

Bit lines 220a-220d are each arranged in a first direction X. Word lines 210a-210e are each arranged in a second direction Y across the first direction X. Pillars (P1-P4) 230a-230d are provided in a region defined by neighboring bit lines 220a-220d and neighboring word lines 210a-210e. Pillars (P1-P4) 230a-230d are arranged along a third direction Z. Bit line contacts 250a, 250b are arranged along the third direction Z. More specifically, the bit line contacts 250a, 250b are formed so that they are disposed alternately between pillars arranged in the third direction Z. The bit line contacts 250a, 250b are coupled to the bit lines 220a, 220c, respectively.

As shown in FIGS. 2a-2d, the pillars may include first, second, third, and fourth pillars P1-P4, and the bit lines may include first, second, third, and fourth bit lines 220a-220d. The first bit line 220a may be provided between the first and the second pillars (P1, P2) 230a, 230b. The second bit line 220b may be provided between the second and the third pillars (P2, P3) 230b, 230c. The third bit line 220c may be provided between the third and the fourth pillars (P3, P4) 230c, 230d.

As shown in FIG. 2c, first and second bit line contacts 250a, 250b are alternatively provided between the pillars 230a-230d. The first bit line contact 250a may be provided between the first and the second pillars (P1, P2) 230a, 230b and coupled to the first bit line 220a. The first bit line contact 250a may be coupled to any of the first and the second pillars (P1, P2) 230a, 230b, and is preferably coupled to both of the first and the second pillars (P1, P2) 230a, 230b.

The second bit line contact 250b may be provided between the third and the fourth pillars (P3, P4) 230c, 230d and coupled to the third bit line 220c. The second bit line contact 250b may be coupled to any of the third and the fourth pillars (P3, P4) 230c, 230d, and is preferably coupled to both of the third and the fourth pillars (P3, P4) 230c, 230d.

The first and the second bit line contacts 250a, 250b are coupled to the pillars 230a-230d through first junction regions 350 each formed at sidewalls of the pillars 230a-230d.

To explain the structure shown in FIGS. 2a-2d in another way, the first pillar (P1) 230a is provided in a first row arranged along the second direction Y. The second pillar (P2) 230b is provided in a second row parallel to the first row. The first bit line 220a extends in the first direction X and is provided between the first and the second pillars (P1, P2) 230a, 230b. The first bit line contact 250a is provided over the first bit line 220a and between the first and the second pillars (P1, P2) 230a, 230b.

The second word line 210b extends in the second direction Y and is provided between the first and the second pillars (P1, P2) 230a, 230b. The second word line 210b may be coupled to any of the first and the second pillar (P1, P2) 230a, 230b.

The first and the second directions X, Y are preferably perpendicular to each other. The third direction Z has an acute angle with respect to any of the first and the second direction.

A low dielectric pattern 320 may be provided between the pillars 230a-230d and the substrate 200. The low dielectric pattern 320 includes but not limited to a silicon oxide material or an air gap. The low dielectric pattern 320 is preferred to have a low dielectric constant to prevent current leakage which can be caused between neighboring first junction regions 350. For example, when a channel is formed between the first junction 350 in the third pillar 230c and the first junction 350 through the substrate 200, a leakage current occurs. The low dielectric pattern 320 can prevent such channel from being created. In this embodiment, the low dielectric pattern 320 will be interchangeably referred to as an air gap 320.

The pillars 230a-230d and the substrate 200 may be formed any conductive material, including but not limited to silicon or a epitaxial silicon.

The word lines 210a-210e and the bit lines 220a-220d may include conductive material including but not limited to metal material, semiconductor material, a combination thereof, etc. The bit line contacts 250a, 250b also may include conductive material including but not limited to metal material, semiconductor material, a combination thereof, etc.

Second junction regions 370 are provided so as to be coupled to the first junction regions 350 through the pillars 230a-230d. For example, the second junction regions 370 may be provided at top surfaces of the pillars 230a-230d.

Interlayer insulating layers 260, 360 are provided between the pillars 230a-230d. The interlayer insulating layers 260, 360 can be formed of the same material or different materials from each other. Also, the interlayer insulating layers 260, 360 can be formed simultaneously at the same process step or formed separately at different process steps. For example, as shown in FIG. 2c, first and second interlayer insulating layers 260, 360 different from each other may be provided between the pillars alternatively.

To explain the structure shown in FIGS. 2a-2d in yet another way, the first, the second, and the third bit lines 220a, 220b, 220c are each arranged in the first direction X. The first and the second word lines 210a, 210b are each arranged in the second direction Y. The first pillar (P1) 230a may be provided between the first bit line 220a and the fourth bit line 220d. The first pillar (P1) 230a may be coupled to the first word line 210a or the second word line 210b. The second pillar (P2) 230b is provided between the first and the second bit lines 220a, 220b and coupled to the second word line 210b or a third word line 210c.

The first bit line contact 250a is arranged along the third direction Z and is disposed between the first and the second pillars (P1, P2) 230a, 230b. The first bit line contact 250a is provided over the first bit line 220a and coupled to the first bit line 220a. The first and the second pillars (P1, P2) 230a, 230b may be coupled to the first bit line 220a through the first bit line contact 250a. The first, the second, the third, and the fourth bit lines 220a-220d form buried bit lines.

The first pillar (P1) 230a is insulated from the first and the fourth bit lines 220a, 220d by the bit line spacers 222. Similarly, the second pillar (P2) 230b is insulated from the first and the second bit lines 220a, 220b by the bit line spacers 222. The bit line spacers 222 may include an insulating material including but not limited to silicon oxide, silicon nitride, silicon oxide nitride, etc.

The bit line spacers 222 insulate the pillars from the bit lines. The bit line spacers 222 may include but not limited to an oxide-containing pattern or a nitride-containing pattern.

The bit line contacts 250a, 250b extends up to a first level L1 and the air gap 320 is preferably formed at a second level L2 lower than the first level L1 so that the bit line contacts 250a, 250b can be coupled to the first junction regions 350 in the pillars 230a-230d. The second junction regions 370 extend down to a third level L3 higher than L1.

The pillars 230a-230d are coupled to word lines 210a-210e. As shown in FIGS. 2a and 2d, for example, the first pillar 230a may be coupled to a first word line 210a. As shown in FIG. 2d, the first word line 210a can extend from a fourth level L4 up to a fifth level L5. The fourth level L4 is higher than the first level L1, and the fifth level L5 is lower than the third level L3.

Preferably, the first and the second directions X, Y are perpendicular to each other. The third direction Z has an acute angle with respect to any of the first and the second direction.

The semiconductor device according an embodiment of the present invention may be applied to a semiconductor device including but not limited to a dynamic random access memory (DRAM), a resistant random access memory (ReRAM), a ferroelectric random access memory (FeRAM), a phase change RAM (PRAM), a magnetic RAM (MRAM), a spin transfer torque-magnetic RAM (STT-RAM), a zero-capacitor RAM (ZRAM), and a combination thereof.

Hereinafter, a method according to an embodiment of the present invention will be described with reference to FIGS. 3a-3o.

Figure 3A:
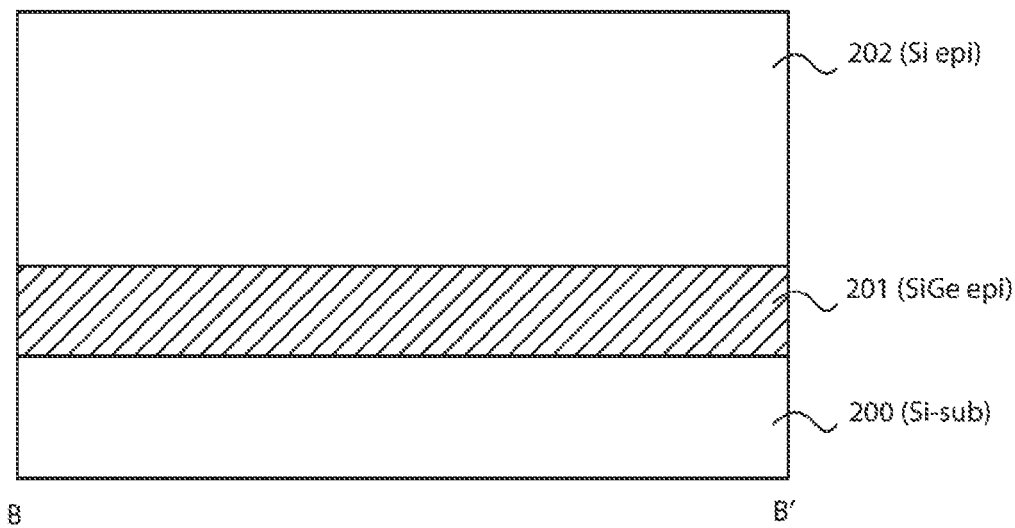
FIGS. 3a-3o show a method of fabricating the semiconductor device of FIG. 2, taken along the line B-B' as shown in FIG. 2c, according to an embodiment of the present invention.

In FIG. 3a, a first epitaxial layer 201 is formed over a substrate 200. The substrate 200 may be a silicon substrate but not limited thereto. The first epitaxial layer 201 may include but not limited to a Si—Ge layer. A second epitaxial layer 202 is formed over the first epitaxial layer 201. The second epitaxial layer 202 may include but not limited to a silicon layer. Each of the first and the second epitaxial layers 201, 202 can be formed using an epitaxial growth method.

Figure 3B:
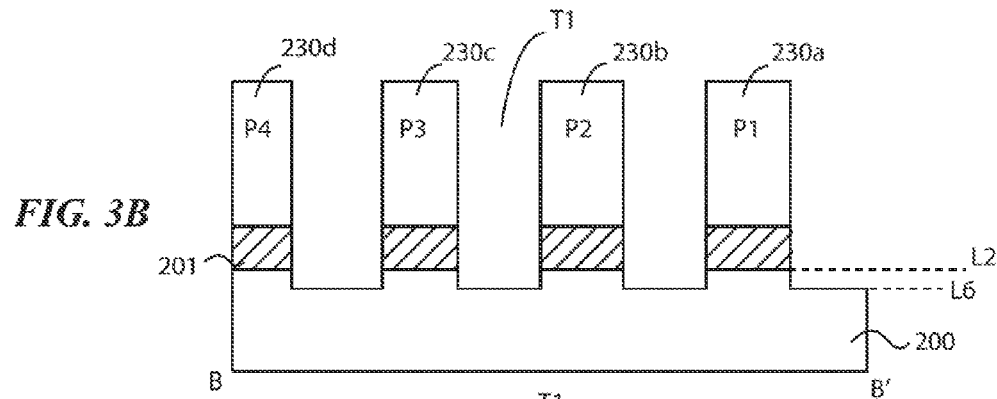

In FIG. 3b, the first and the second epitaxial layers 201, 202 are patterned to form first through fourth pillars 230a-230d. First trenches T1 are generated between the first through the fourth pillars 230a-230d.

In this embodiment, the first trenches T1 expose the substrate 200. Thus, the first epitaxial layer 201 is completely removed in the areas where the first trenches are formed. However, the first epitaxial layer 201 can be removed partially so long as sidewalls of the first epitaxial layer 201 are exposed by the trenches T1. In other words, the first epitaxial layer 201 can be removed partially so long as bottoms of the trenches are at a sixth level L6 lower than the second level L2.

The pillars may have a cylinder shape or a polygon shape. The pillars 230a-230d are arranged along a direction Z, as shown in FIG. 2a.

Figure 3C:
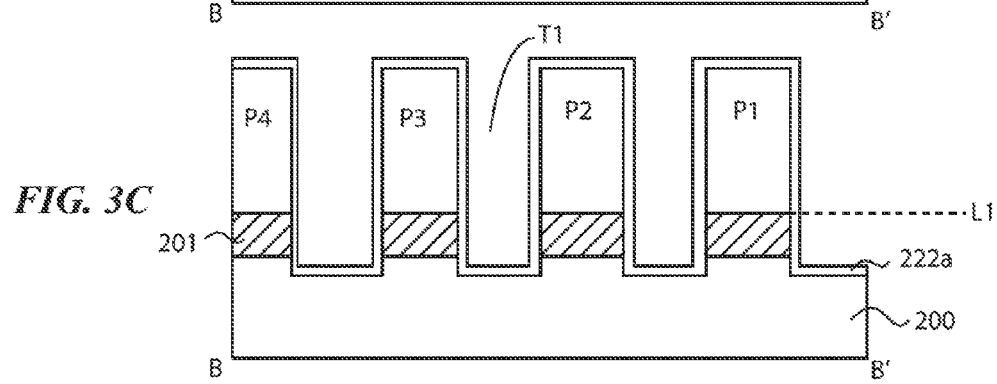
Figure 3D:
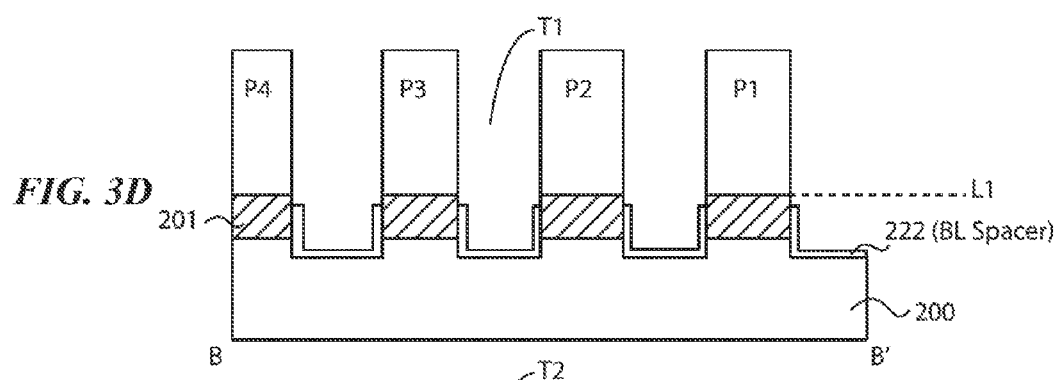

In FIGS. 3c and 3d, a bit line spacer layer 222a is formed over the pillars 230a-230d. The bit line layer 222a is patterned to form bit line spacers 222. The bit line layer 222a can be patterned using an etch back method, but not limited thereto. The bit line spacers 222 are formed along a lower portion of the first trenches T1. The bit line spacers 222 may be disposed at bottoms and lower inner sidewalls of the first trenches T1.

In this embodiment, the bit line spacer layer 222a is formed after the pillars 230a-230d are formed. However, the bit line spacer layer 222a may be formed before pillars 230a-230d are formed.

Figure 3E:
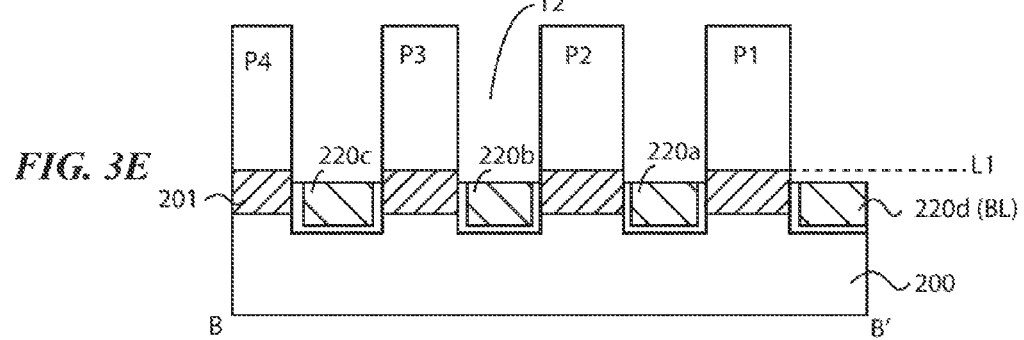

In FIG. 3e, the first trenches T1 are filled with a conductive material. The conductive material is subject to an etch-back process until top surfaces of the bit line spacers 222 are exposed. As a result, first through fourth bit lines 220a-220d are formed in lower portions of the first trenches T1, and second trenches T2 are formed over the bit lines 220a-220d. The bit lines 220a-220d each extend in the direction X, as shown in FIG. 2a. The bit lines 220a-220d are insulated from the pillars 230a-230d by the bit line spacers 222. The conductive material used to form the bit lines 220a-220d may include a metal or a semiconductor material. Metal material used to form the bit lines 220a-220d may include, but is not limited to, W (tungsten), Cu (copper), Ti, TiN, etc. Semiconductor material used to form the bit lines 220a-220d may include, but is not limited to, poly silicon, silicide, etc.

Figure 3F:
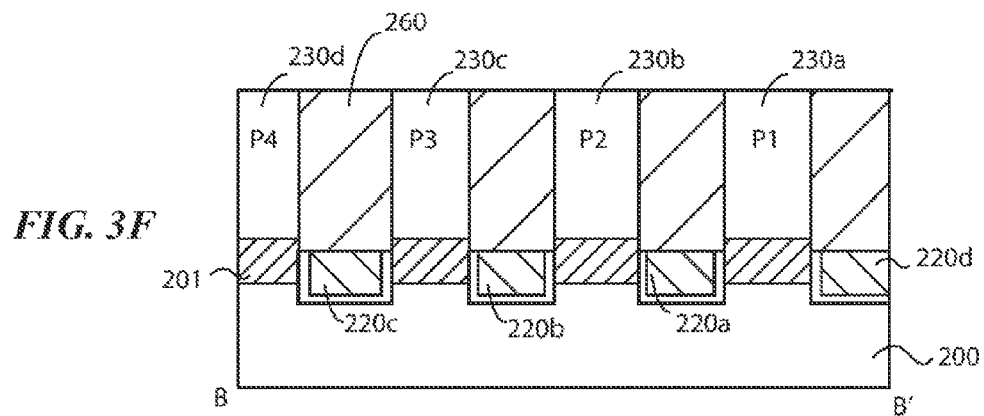

In FIG. 3f, dielectric material fills the second trenches T2 and then patterned to expose upper surface of the pillars 230a-230d, thus forming first interlayer insulating patterns 260 between the pillars 230a-230d.

Figure 3G:
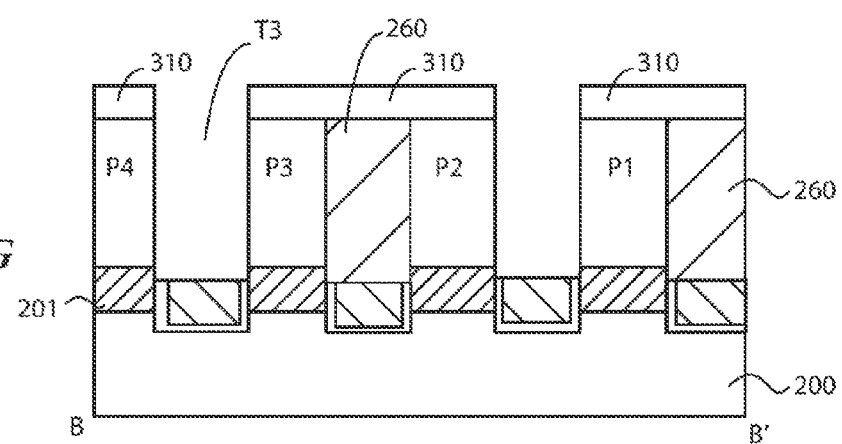

In FIG. 3g, a hard mask 310 alternatively exposing the first interlayer insulating patterns is formed. That is, the hard mask 310 can be formed to even-numbered bit lines and not exposing the odd-numbered bit line which are below the first interlayer insulating pattern 260.

For example, the hard mask may be formed to expose (i) the first interlayer insulating pattern 260 between the first and the second pillars 230a, 230b, and (ii) the first interlayer insulating patterns 260 between the third and the fourth pillars 230c, 230d. Then, (i) the first interlayer insulating pattern 260 between the first and the second pillars 230a, 230b, and (ii) the first interlayer insulating patterns 260 between the third and the fourth pillars 230c, 230d are removed to form third trenches T3. The third trenches are formed to expose the first epitaxial layers 201 are exposed.

Figure 3H:
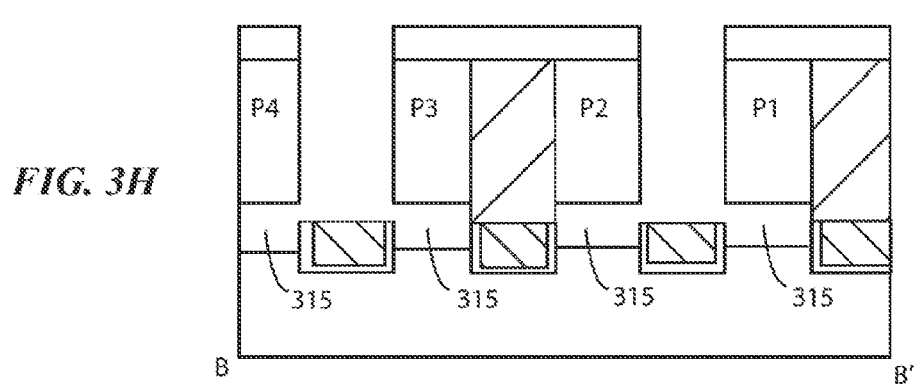

In FIG. 3h, the first epitaxial layers 201 are removed to form cavities 315 between the pillars 230a-230d and the substrate 200. The first epitaxial layers 201 may be removed using a wet etching process but not limited thereto. The cavities 315 can be filled with a low dielectric material or remain empty. When the cavities 315 are filled with a low dielectric material, the low dielectric material is preferred to have a dielectric constant of 4 or less. In this embodiment, the cavities 315 are remained empty.

Figure 3I:
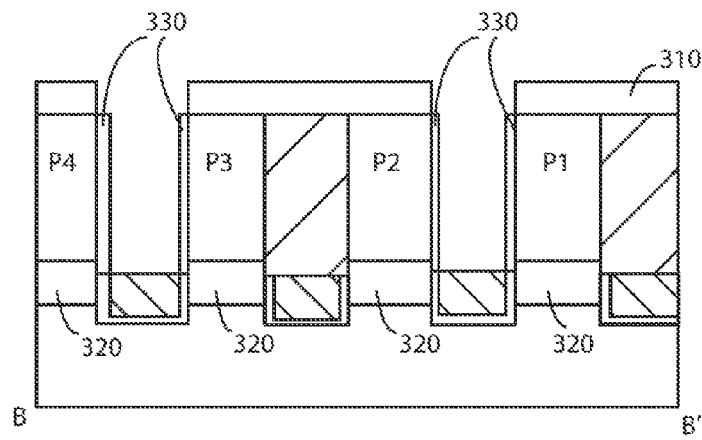

In FIG. 3i, first pillar spacer layers 330 are formed along sidewalls of the third trenches T3. The first pillar spacer layers 330 are preferred to be formed using dielectric material having a poor coverage property so that the first pillar spacer layers 330 can enclose the cavities 315 to form air gaps 320 between the pillars 230a-230d and the substrate 200.

Figure 3J:
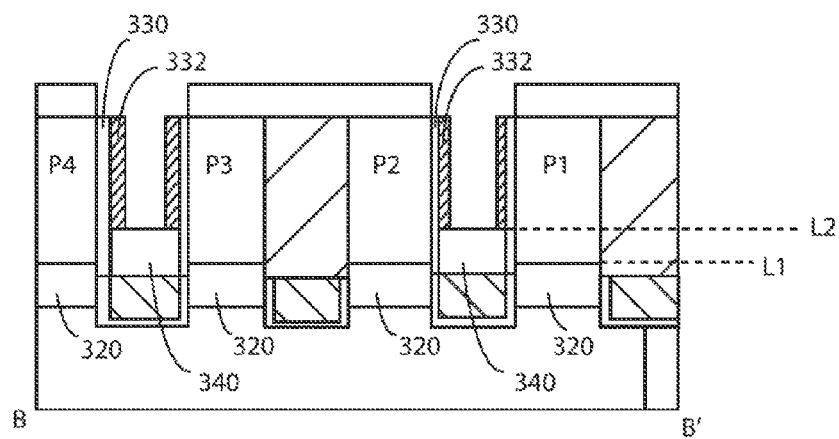

In FIG. 3j, sacrificial patterns 340 are formed in lower portions of the third trenches T3. The sacrificial patterns 340 extend up to the second level L2 higher than the first level L1. Then, second pillar spacer patterns 332 are formed along sidewalls of the first pillar spacer layer 330 and over the sacrificial pattern 340.

Figure 3K:
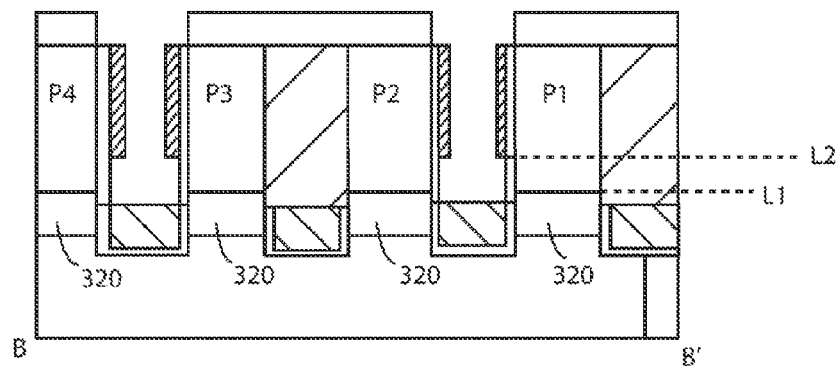

In FIG. 3k, the sacrificial patterns 340 are removed. As a result, lower sidewalls of the first pillar spacer layers 330 are exposed.

Figure 3L:
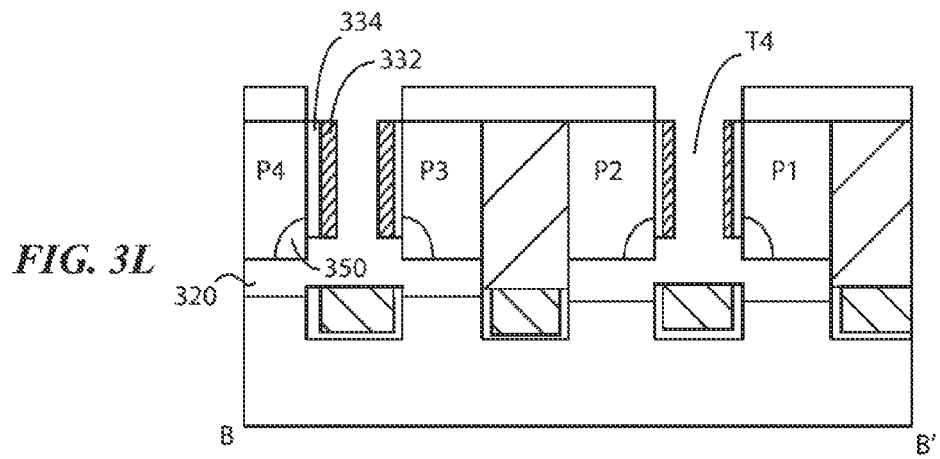

In FIG. 3l, the first pillar spacer layers 330 are patterned using the second pillar spacer layers 332 as masks to form first pillar spacer patterns 334 exposing sidewalls of the pillars 230a-230d. Fourth trenches generated when the first pillar spacer layers 330 are patterned into the first pillar spacer patterns 334. Then, impurities are implanted through the fourth trenches into the sidewalls of the pillars 230a-230d to form first injunction regions 350.

Figure 3M:
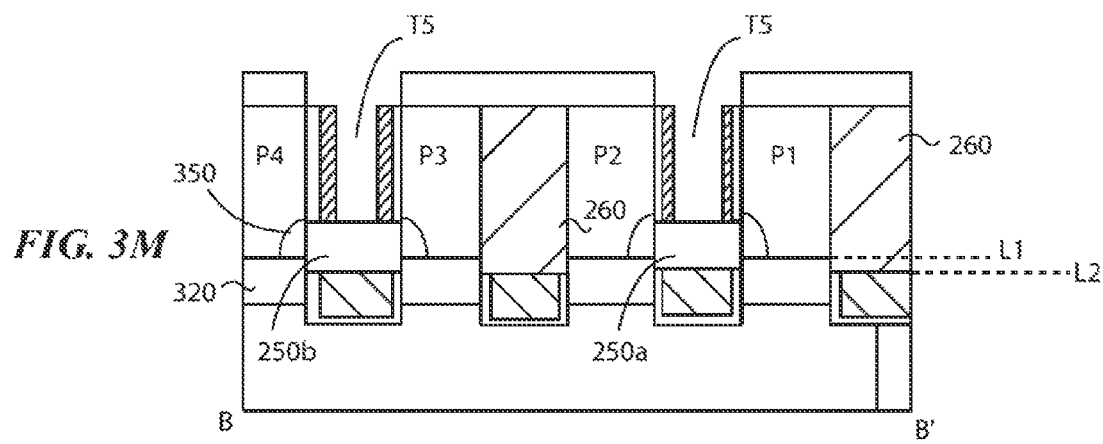

In FIG. 3m, conductive material fills lower portions of the fourth trenches to form bit line contacts 250a, 250b. The bit line contacts 250 are configured to couple the first junction regions 350 and the bit lines 220a-220d. For this purpose, upper surfaces of the bit line contacts 250b are preferred to extend up to a level higher than the first level L1 up to which the air gaps 320 extend.

In FIG. 3m, the bit line contacts 250a, 250b are formed with maintaining the first and the second pillar spacer patterns 334, 332. However, the first and the second pillar spacer patterns 334, 332 can be removed before the bit line contacts 250b are formed. Fifth trenches T5 are generated when the bit line contacts 250b are formed.

The bit line contacts 250a, 250b are formed between pillars arranged in the direction Z. Thus, the bit line contacts 250a, 250b are also arranged in the direction Z.

Since the bit line contacts 250a, 250b are arranged in an oblique direction (i.e., the Z direction) with respect to the directions X and Y, a distance W2, as shown in FIG. 2a, between a given pillar and a bit line contact adjacent to the given pillar can be increased without increasing a distance between pillars arranged along the direction X. See FIG. 2a.

For example, compared with the distance W1 of the conventional device shown in FIG. 1a, which is the width of the insulating film 140 disposed between the bit line contact 150 and an adjacent pillar, the distance W2 may be much greater, assuming the devices have the same unit cell size.

In the conventional device, in order to increase the distance W1, a distance between pillars arranged in the direction X should be increased. Increasing the distance between pillars arranged in the direction X necessarily causes the unit cell size to increases as well. In contrast, according to an embodiment of the present invention, the distance W2 between a given pillar 230a-230d and a bit line contact 250a, 250b adjacent to the given pillar can be increased without increasing a distance between pillars arranged in the direction X by arranging the bit line contacts 250a, 250b along the direction Z, which extends in an oblique line with respect to the directions X and Y. When the bit line contacts 250a, 250b are formed to have a small width, the distance W2 can be further increased.

The bit line contacts 250a, 250b are formed so that they are disposed between alternate pillars arranged along the direction Z. For example, if the first bit line contact 250a is formed between the first and the second pillars 230a, 230b, the second bit line contact 250b may be formed between the third and the fourth pillars 230c, 230d, but there is no bit line contact is formed between the second and the third pillars 230b, 230c.

The first bit line contact 250a is coupled to the first bit line 220a so that the first bit line 220a is coupled to the first and the second pillars 230a, 230b. The second bit line contact 250b is coupled to the third bit line 220c so that the third bit line 220c is coupled to the third and the fourth pillars 230c, 230d.

The bit line contacts 250a, 250b may include a metal material or a semiconductor material. Metal material included in the bit line contacts 250a, 250b may include, but is not limited to, W (tungsten), Al, Cu, Ti, TiN, a combination thereof, etc. Semiconductor material included in the bit line contacts 250a, 250b may include, but is not limited to, poly silicon, silicide, Se—Ge composite, etc.

As a result of the formation of the bit line contacts 250a, 250b, third trenches T3 are formed over the first and the second bit line contacts 250a, 250b and over the first and the and the third bit lines 220a, 220c.

Figure 3N:
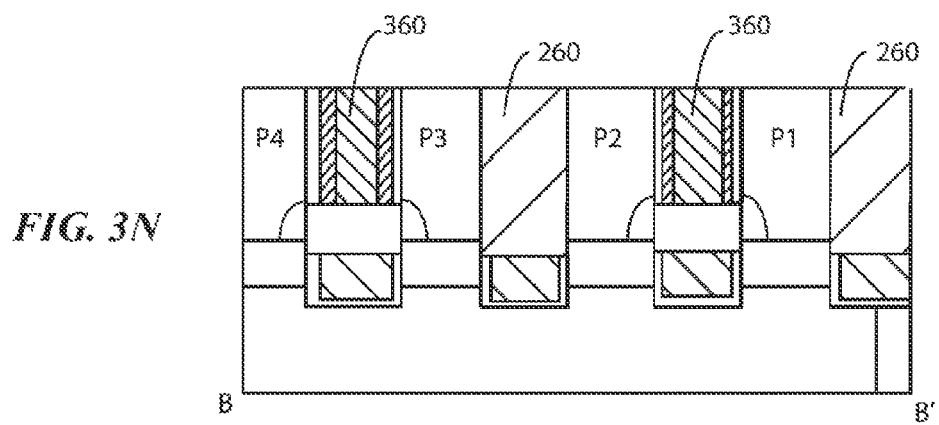
Figure 30:
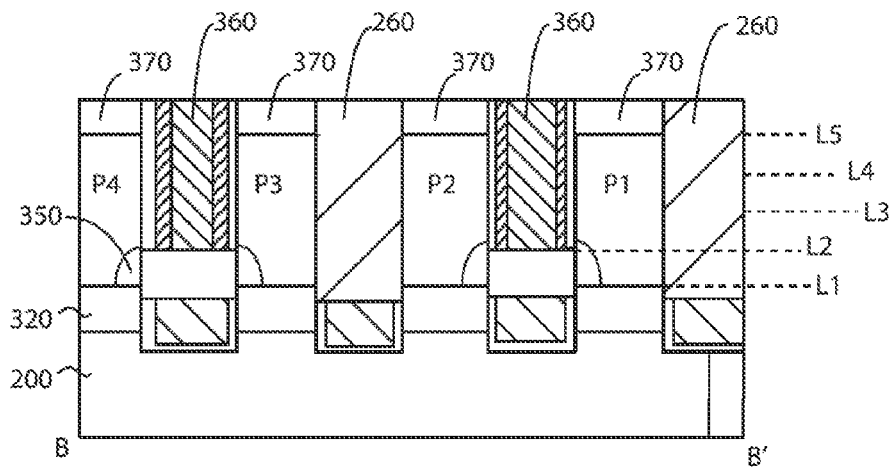

In FIG. 3n, a dielectric material fill the fifth trenches T5 to form second interlayer insulating patterns 360 (i) between the first and the second pillars 320a, 320b and (ii) between the third and the fourth pillars 320c, 320d. The hard mask 310 is removed. As a result, the first interlayer insulating layer 260 are exposed (i) between the second and the third pillars 230b, 230c. The second interlayer insulating patterns 360 can be formed of a material as same as or different from the first interlayer insulating patterns 260.

The first and second interlayer insulating layers 260, 360 each may be formed of a material including but not limited to silicon oxide, silicon nitride, silicon oxide nitride, etc.

In FIG. 3o, second junction regions 370 are formed in upper portions of the pillars 230a-230d. The second junction regions 370 may extend down to a level L5. Then, word lines 210a-210d are formed sidewalls of the pillars 230a-230d along the direction Y shown in FIG. 2a. The word lines 210a-210d are provided between the levels L3 and L4. The level L3 is higher than the level L2 up to which the bit line contacts 250a, 250b extend. The level L4 is lower than the level L5 down to which the second junction regions 370 extend. It is preferable that the direction X in which the bit lines 220a-220d extend and the direction Y in which the word lines 210a-210d extend are perpendicular to each other. It is desirable that the direction Z in which the bit line contacts 250a, 250b are arranged have acute angles with respect to either of the first and the second directions X, Y.

According to embodiments of the present invention, the distance W2 between a given pillar 230a-230d and an adjacent bit line contacts 250a, 250b can be increased without increasing the unit cell size. Thus, a number of net dies per a wafer can be increased and production costs can be lowered.

FIGS. 4-7 show semiconductor memory devices employing a structure according to an embodiment of the present invention.

Figure 4:
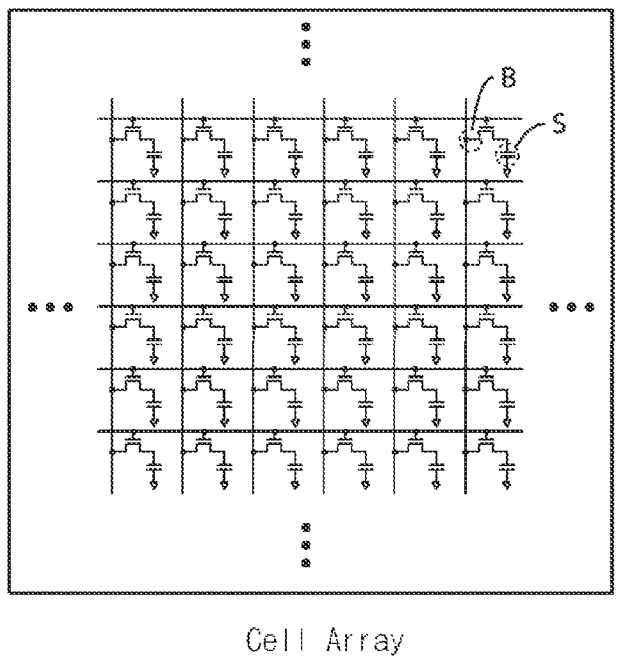
FIG. 4 is a circuit diagram of a memory cell array employing the semiconductor device according to an embodiment of the present invention.

FIG. 4 is a circuit diagram of a memory cell array according to an embodiment of the present invention. The memory cell array may include bit lines (B) and storage nodes (S) coupled to the bit lines (B) through a cell gate.

As shown in FIG. 4, in the memory cell array, the bit lines (BL1, . . . , BLn) are formed to extend in a first direction (or "bit line direction"), and the word lines (WL1, . . . WLm) are formed to extend in a second direction (or "word line direction"), so that they are arranged to intersect with each other. A first terminal (e.g., drain) of the transistor is coupled to the bit lines (BL1, . . . , BLn), a second terminal (e.g., source) of the transistor is coupled to a capacitor, and a third terminal (e.g., gate) of the transistor is coupled to the word lines (WL1, . . . , WLm). The plurality of memory cells including the bit lines (BL1, . . . , BLn) and the word lines (WL1, . . . , WLm) are located in the semiconductor memory cell array.

Figure 5:
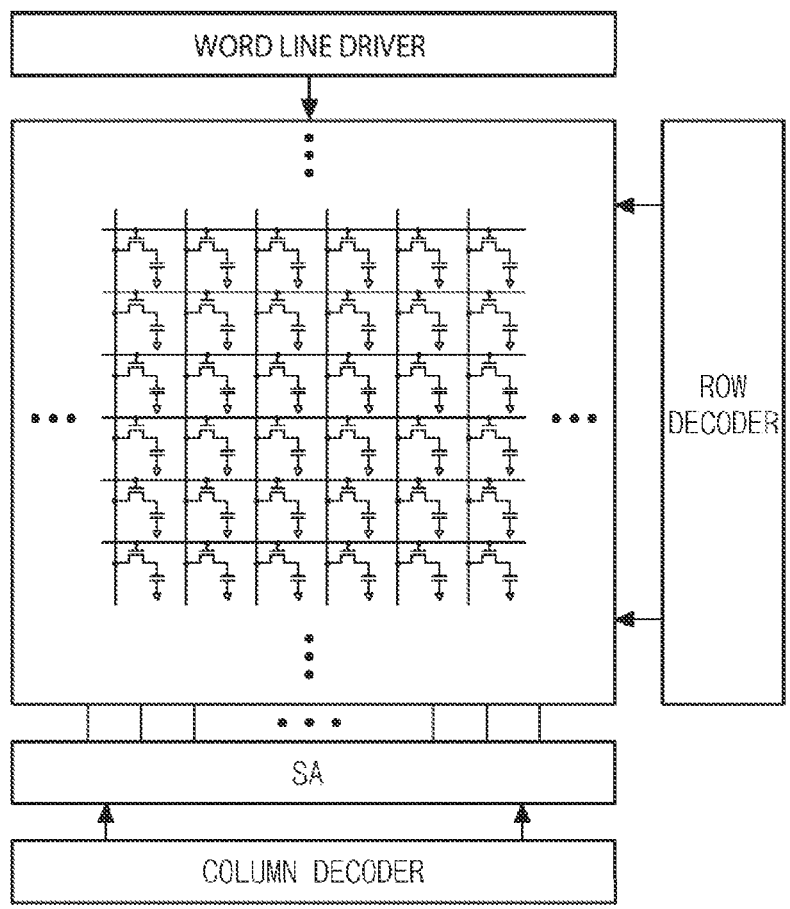
FIG. 5 is a block diagram that shows a functional unit employing the memory cell array shown in FIG. 4.

FIG. 5 is a block diagram of a functional unit employing the memory cell array shown in FIG. 4. A row decoder and a word line driver are configured to select the cell gates. A column decoder is configured to select the bit lines (B). A sense amplifier (SA) is configured to sense data transmitted to/from the bit lines (B).

Figure 6:
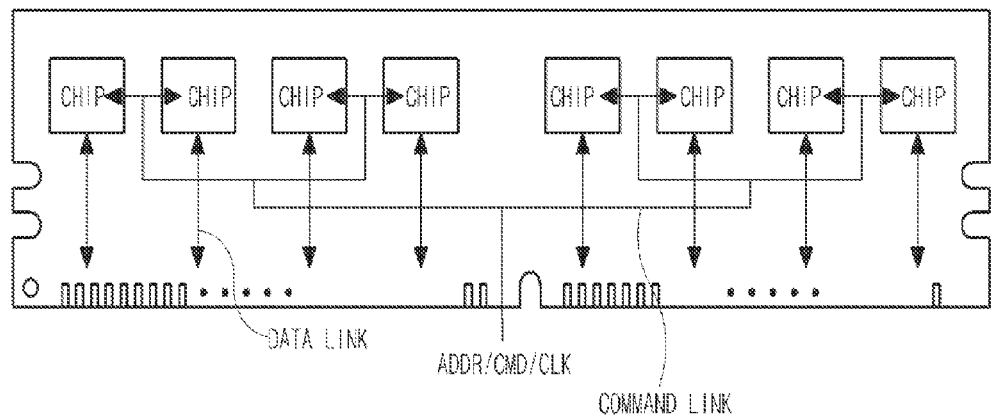
FIG. 6 is a block diagram of a memory module employing the module shown in FIG. 5.

FIG. 6 is a block diagram of a memory module employing the module shown in FIG. 5. The memory module comprises a plurality of semiconductor devices mounted on a module substrate, a command link for enabling the semiconductor device to receive a control signal (address signal (ADDR)), a command signal (CMD) and a clock signal (CLK) and a data link for transmitting data connected to the semiconductor device.

The command link and the data link may be the same or similar to those used in a conventional semiconductor module. Although FIG. 6 shows that eight chips are mounted on the front surface of the module substrate, additional chips can be mounted on the rear surface of the module substrate in the same manner. Alternatively, additional chips can be mounted on a back side of the module substrate, and the number of chips mounted is not limited.

Figure 7:
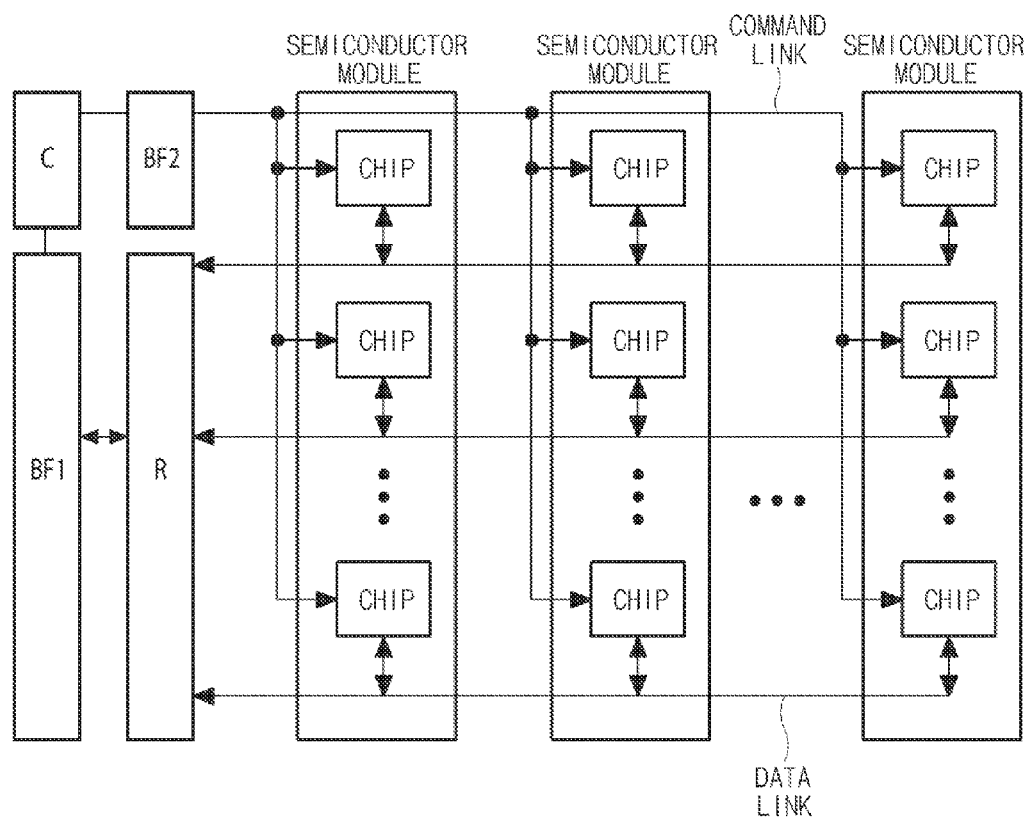
FIG. 7 is a block diagram of a memory system employing the module shown in FIG. 6.

FIG. 7 is a block diagram of a memory system employing the module shown in FIG. 6. The memory system includes a plurality of memory modules and a controller for communicating with the memory module through a system bus to exchange data and a command/address signal.

A data input/output buffer (BF1) is coupled to the sense amplifier, a command/address input/output buffer (BF2) is coupled to any of the column decoder and the row decoder, and a resistor (R) couples the data input/output buffer to the sense amplifier (SA). A memory controller (C) may be coupled to any of the row decoder and the column decoder.

Generally, a memory cell array comprises a plurality of memory cells each including one transistor and one capacitor. Such memory cells are located at intersections of bit lines (BL1, . . . , BLn) and word lines (WL1, . . . , WLm). The memory cells are configured to store or output data depending on voltages applied to the bit lines (BL1, . . . , BLn) and the word lines (WL1, . . . , WLm) selected by a column decoder and a row decoder, respectively.

The memory device according to an embodiment of the present invention may be applied to dynamic random access memories (DRAMs), or synchronous dynamic random access memories (DRAMs), but it is not limited thereto. It may be applied to static random access memories (SRAMs), flash memories, ferroelectric random access memories (FeRAMs), magnetic random access memories (MRAMs), or phase change random access memories (PRAMs).

The memory device can be used, for example, in desktop computers, portable computers, computing memories used in servers, graphics memories having various specs, and mobile electronic devices as technology continues to evolve. Further, the above-described semiconductor device may be provided to various digital applications such as mobile recording mediums including a memory stick, multimedia card (MMC), secure digital (SD), compact flash (CF), extreme digital (xD) picture card, and a universal serial bus (USB) flash device as well as various applications such as MP3P, portable multimedia player (PMP), a digital camera, a camcorder, and a mobile phone. A semiconductor device may be applied to a technology such as multi-chip package (MCP), disk on chip (DOC), or embedded device. The semiconductor device may be applied to a CMOS image sensor to be provided to various fields such as a camera phone, a web camera, and a small-size image capture device for medicine.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device comprising:
   bit lines each extending in a first direction;
   word lines each extending in a second direction, which crosses the first direction;
   pillars provided in a region between the bit lines and the word lines, wherein the pillars are each arranged along a third direction; and
   bit line contacts arranged along the third direction and alternately between the pillars and coupled to alternate bit lines,
   wherein the bit line contacts are provided over the bit lines.

2. The semiconductor device of claim 1,
   wherein the pillars includes first, second, third, and fourth pillars each arranged along the third direction,
   wherein the bit lines include first, second, and third bit lines, wherein the first bit line is provided between the first and the second pillars, the second bit line is provided between the second and the third pillars, and the third bit line is provided between the third and the fourth pillars,
   wherein the bit line contacts include first and second bit line contacts,
   wherein the first bit line contact is provided between the first and the second pillars and is coupled to the first bit line, and
   wherein the second bit line contact is provided between the third and the fourth pillars and is coupled to the third bit line.

3. The semiconductor device of claim 2,
   wherein the first bit line contact is coupled to the first or the second pillars, and wherein the second bit line contact is coupled to any of the third and the fourth pillars.

4. The semiconductor device of claim 2,
wherein the first bit line contact is coupled to both of the first and the second pillars, and
wherein the second bit line contact is coupled to both of the third and the fourth pillars.

5. The semiconductor device of claim 1,
wherein the pillars are formed over a semiconductor substrate, and
wherein the semiconductor device further comprising a dielectric pattern between any of the pillars and the semiconductor substrate.

6. The semiconductor device of claim 5, the semiconductor device further comprising:
first junction regions formed in the pillars and coupled to bit line contacts.

7. The semiconductor device of claim 6,
wherein the dielectric pattern is configured to prevent a channel from being created between neighboring first junction regions through the semiconductor substrate.

8. The semiconductor device of claim 5,
wherein the dielectric pattern is an air gap.

9. A semiconductor device comprising:
a first pillar provided in a first row arranged in a first direction;
a second pillar provided in a second row parallel to the first row;
a first bit line extending in a second direction across the first direction and provided between the first and the second pillars; and
a first bit line contact provided over the first bit line and between the first and the second pillars.

10. The semiconductor device of claim 9,
wherein the first bit line contact is coupled to any of the first and the second pillars.

11. The semiconductor device of claim 9, the device further comprising:
a first word line extending in the first direction and provided between the first and the second pillars,
wherein the first word line is coupled to the first or the second pillar.

12. The semiconductor device of claim 9,
wherein the first and the second directions are perpendicular to each other,
wherein the first and the second pillars are arranged along a third direction, and
wherein the third direction has an acute angle with respect to any of the first and the second direction.

13. The semiconductor device of claim 9,
wherein the first and the second pillars are formed over a semiconductor substrate, and
wherein the semiconductor device further comprising a dielectric pattern between any of the first and the second pillars and the semiconductor substrate.

14. The semiconductor device of claim 13, the semiconductor device further comprising:
first junction regions formed in the pillars and coupled to bit line contacts.

15. The semiconductor device of claim 14,
wherein the dielectric pattern is configured to prevent a channel from being created between neighboring first junction regions through the semiconductor substrate.

16. The semiconductor device of claim 13,
wherein the dielectric pattern is an air gap.

17. A semiconductor device comprising:
first, second, and third bit lines each extending in a first direction;
first and second word lines each extending in a second direction;
a first pillar provided between the first and the second bit lines and coupled to the first word line;
a second pillar provided between the second and the third bit lines and coupled to the second word line; and
a first bit line contact between the first and the second pillars arranged along a third direction, wherein the first bit line contact is coupled to the second bit line and provided over the second bit line.

18. The semiconductor device of claim 17,
wherein any of the first and the second pillars is coupled to the second bit line through the first bit line contact.

19. The semiconductor device of claim 17,
wherein both of the first and the second pillars are coupled to the second bit line through the first bit line contact.

20. The semiconductor device of claim 17,
wherein the first, the second, and the third bit lines are buried bit lines.

21. The semiconductor device of claim 17,
wherein the first pillar is insulated from the first and the second bit lines, and
wherein the second pillar is insulated from the second and the third bit lines.

22. The semiconductor device of claim 17,
wherein the first and the second pillars are formed over a semiconductor substrate, and
wherein the semiconductor device further comprising a dielectric pattern between any of the first and the second pillars and the semiconductor substrate.

23. The semiconductor device of claim 22,
wherein the dielectric pattern extends down to a first level,
wherein the first and the second bit line contacts each extend up to a second level higher than the first level, and
wherein the first and the second word lines each extend up from a third level higher than the second level.

24. The semiconductor device of claim 22,
wherein the first and the second pillars are formed over a semiconductor substrate, and
wherein the semiconductor device further comprising a dielectric pattern between any of the first and the second pillars and the semiconductor substrate.

25. The semiconductor device of claim 24, the semiconductor device further comprising:
first junction regions formed in the pillars and coupled to bit line contacts.

26. The semiconductor device of claim 25,
wherein the dielectric pattern is configured to prevent a channel from being created between neighboring first junction regions through the semiconductor substrate.

27. The semiconductor device of claim 24,
wherein the dielectric pattern is an air gap.

28. The semiconductor device of claim 17, the device further comprising:
a first bit line spacer configured to insulate the first pillar from the first and the second bit lines; and
a second bit line spacers configured to insulate the second pillar from the second and the third bit lines.

29. The semiconductor device of claim 28,
wherein the first bit line spacer is provided (i) between the first pillar and the first bit line and (ii) between the first pillar and the second bit line; and wherein the second bit line spacer is provided (i) between the second pillar and the second bit line and (ii) between the second pillar and the third bit line.

30. The semiconductor device of claim 28, wherein each of the first and the second bit line spacers includes any of an oxide-containing pattern, a nitride-containing pattern, or a combination thereof.

31. The semiconductor device of claim 17, wherein the first word line is coupled to the first pillar at a sidewall of the first pillar, and
wherein the second word line is coupled to the second pillar at a sidewall of the second pillar.

32. The semiconductor device of claim 17, wherein the first and the second directions are perpendicular to each other, and
wherein the third direction has an acute angle with respect to any of the first and the second directions.

33. The semiconductor device of claim 17, wherein the semiconductor device includes a dynamic random access memory (DRAM), a synchronous dynamic random access memory (SRAM), a static random access memory (SRAM), a flash memory, a ferroelectric random access memory (FeRAM), a magnetic random access memory (MRAM), a phase change random access memory (PRAM), or a combination thereof.

* * * * *